United States Patent
Zhang et al.

(10) Patent No.: US 12,156,415 B2
(45) Date of Patent: Nov. 26, 2024

(54) METHOD OF PATTERNING LIGHT EMITTING LAYER, AND METHOD OF MANUFACTURING LIGHT-EMITTING DIODE DEVICE

(71) Applicant: BOE TECHNOLOGY GROUP CO., LTD., Beijing (CN)

(72) Inventors: Xiaoyuan Zhang, Beijing (CN); Hu Meng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 331 days.

(21) Appl. No.: 17/762,770

(22) PCT Filed: May 28, 2021

(86) PCT No.: PCT/CN2021/096569
§ 371 (c)(1),
(2) Date: Mar. 23, 2022

(87) PCT Pub. No.: WO2022/001531
PCT Pub. Date: Jan. 6, 2022

(65) Prior Publication Data
US 2023/0021056 A1   Jan. 19, 2023

(30) Foreign Application Priority Data

Jun. 30, 2020   (CN) .......................... 202010623630.X

(51) Int. Cl.
*H01L 51/00*   (2006.01)
*H10K 50/115*   (2023.01)
(Continued)

(52) U.S. Cl.
CPC .......... *H10K 50/115* (2023.02); *H10K 50/16* (2023.02); *H10K 50/828* (2023.02);
(Continued)

(58) Field of Classification Search
CPC .. H10K 50/115; H10K 50/828; H10K 59/122; H10K 71/00
See application file for complete search history.

(56) References Cited

U.S. PATENT DOCUMENTS 7,396,637 B2   7/2008   Itou et al.
10,431,744 B2   10/2019   Kwon et al.
(Continued)

FOREIGN PATENT DOCUMENTS

| CN | 103137904 A | 6/2013 |
| CN | 106575607 A | 4/2017 |

(Continued)

OTHER PUBLICATIONS

Third Office Action (Aug. 30, 2023) in the corresponding Chinese Application No. 202010623630.X and Search Report.
(Continued)

*Primary Examiner* — Anthony Ho
(74) *Attorney, Agent, or Firm* — Chiwin Law LLC

(57) ABSTRACT

A method of patterning a light-emitting layer and a method of manufacturing a light-emitting diode device are provided, including: providing a substrate; forming a first electrode layer on the substrate; forming a sacrificial layer on the first electrode layer; patterning the sacrificial layer to remove the sacrificial layer in a first region of the substrate and retain the sacrificial layer in a second region of the substrate, the first electrode layer is at least partially located in the first region; forming a first carrier auxiliary layer in the first region and the second region; forming a light-emitting layer on the first carrier auxiliary layer, and removing the retained sacrificial layer in the second region and the first carrier auxiliary layer and the light-emitting layer covering the retained sacrificial
(Continued)

layer, and retaining the first carrier auxiliary layer and the light-emitting layer in the first region, to pattern the light-emitting layer.

19 Claims, 8 Drawing Sheets

(51) Int. Cl.
| | |
|---|---|
| *H10K 50/16* | (2023.01) |
| *H10K 50/828* | (2023.01) |
| *H10K 59/122* | (2023.01) |
| *H10K 71/00* | (2023.01) |
| *H10K 85/20* | (2023.01) |
| *H10K 85/60* | (2023.01) |
| *H10K 59/12* | (2023.01) |
| *H10K 102/10* | (2023.01) |

(52) U.S. Cl.
CPC ........... *H10K 59/122* (2023.02); *H10K 71/00* (2023.02); *H10K 85/215* (2023.02); *H10K 85/623* (2023.02); *H10K 85/6572* (2023.02); *H10K 59/1201* (2023.02); *H10K 2102/103* (2023.02)

(56) References Cited

U.S. PATENT DOCUMENTS

| | | |
|---|---|---|
| 2009/0087792 A1 | 4/2009 | Iizumi et al. |
| 2017/0256754 A1 | 9/2017 | Defranco et al. |
| 2018/0261769 A1* | 9/2018 | Kwon ................... G03F 7/16 |
| 2021/0043877 A1 | 2/2021 | Defranco et al. |

FOREIGN PATENT DOCUMENTS

| | | |
|---|---|---|
| CN | 107112417 A | 8/2017 |
| CN | 108574056 A | 9/2018 |
| CN | 109873091 A | 6/2019 |
| CN | 110459677 A | 11/2019 |
| CN | 111276618 A | 6/2020 |
| KR | 20180068239 A | 6/2018 |
| WO | 03086024 A1 | 10/2003 |

OTHER PUBLICATIONS

First Office Action in the corresponding Chinese Application No. 202010623630.X and Search Report.

* cited by examiner

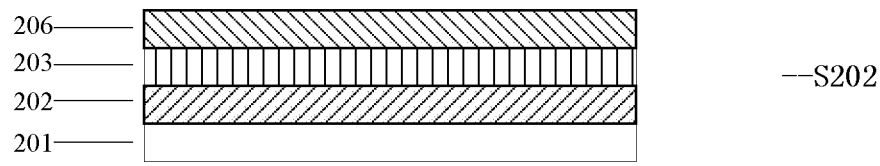
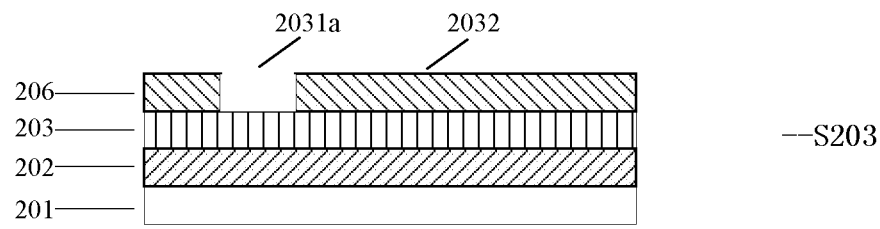
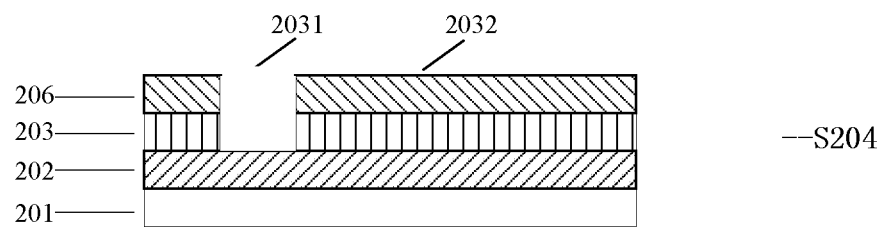
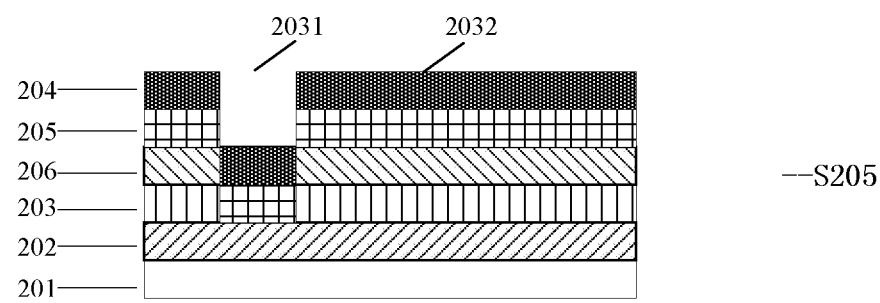
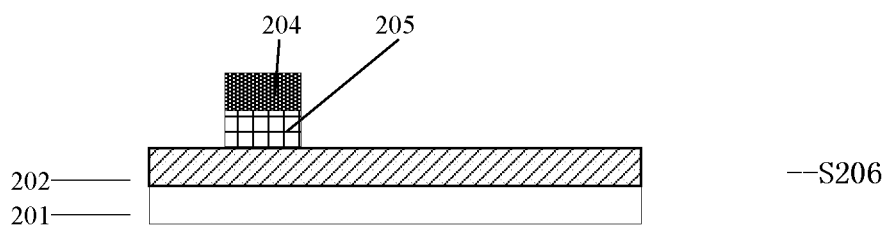
FIG. 2

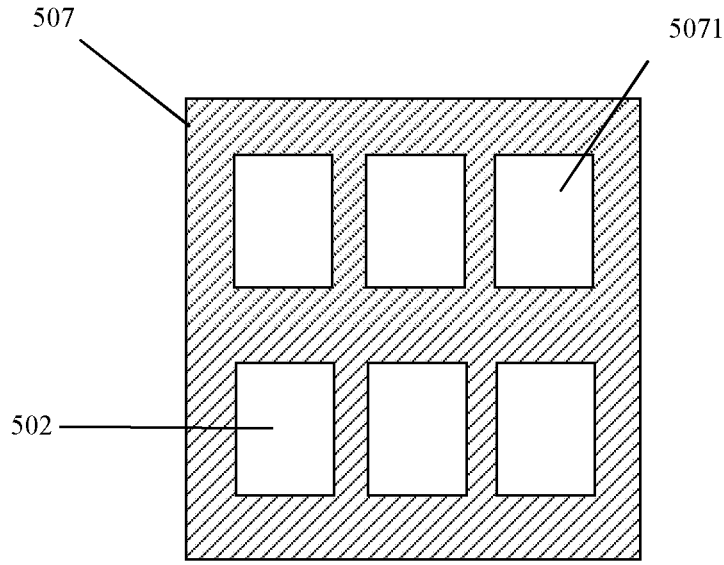

FIG. 5B forming a patterned light-emitting layer or a plurality of (e.g., three) independent patterned light-emitting layers by the method of patterning the light-emitting layer of the embodiments as shown in any one of FIGS. 2-5, and the patterned light-emitting layer or the plurality of patterned light-emitting layers are coupled with the first electrode layer via the electron transport layer, forming successively a hole transport layer and a hole injection layer on the patterned light-emitting layer or each of the plurality of the patterned light-emitting layers.

forming a second electrode layer on the hole injection layer.

FIG. 6

METHOD OF PATTERNING LIGHT EMITTING LAYER, AND METHOD OF MANUFACTURING LIGHT-EMITTING DIODE DEVICE

CROSS-REFERENCE TO RELATED APPLICATIONS

This application is a U.S. National Phase Entry of International Application No. PCT/CN2021/096569 filed on May 28, 2021, designating the United States of America and claiming priority to Chinese Patent Application No. 202010623630.X, filed on Jun. 30, 2020. The present application claims priority to and the benefit of the above-identified applications and the above-identified applications are incorporated by reference herein in their entirety.

TECHNICAL FIELD

Embodiments of the present disclosure relate to a method of patterning a light-emitting layer and a method of manufacturing a light-emitting diode device.

BACKGROUND

Light-emitting Diodes (LEDs) are common light-emitting devices, which emit light through energy release caused by the combination of electrons and holes. The light-emitting diodes can effectively convert electric energy into light energy, and have a wide range of applications in the modern society, such as illumination, panel display, medical devices, or the like. For example, the light-emitting diodes can comprise, but are not limited to, Organic Light-emitting Diodes (OLEDs), Quantum Dot Light-emitting Diodes (QLEDs), or the like.

Quantum dots are semi-conductor nanomaterials which can bind excitons in three-dimensional space. Quantum dots have a great potential in high color quality display due to its superior properties including high quantum efficiency, narrow excitation spectrum, high optical stability, long fluorescence lifetime, and good solution processing compatibility, etc. Quantum dot light-emitting diodes are devices which use quantum dots as light-emitting materials. They have higher color gamut and better color display effect compared with the liquid crystal display devices, and also have certain advantages compared with the organic light-emitting diodes (OLEDs). Thus, quantum dot light-emitting devices are expected to become important next-generation display technology.

Recently, with the continuous improvement of properties of quantum dot materials and the continuous optimization of electroluminescent devices, it has made a great progress in both efficiency and light-emitting lifetime. Up to now, the maximum efficiency has exceeded 40 cd/A in red quantum dot light-emitting devices, exceeded 120 cd/A in green devices, and exceeded 17 cd/A in blue devices. In terms of lifetime, the lifetime T50 of red quantum dot devices at 100 nits has reached 2.2 million hours; and in the future, with a further improvement of material properties, quantum dot luminescence technology will have better development.

SUMMARY

At least an embodiment of the present disclosure provides a method of patterning a light-emitting layer, comprising: providing a substrate; forming a first electrode layer on the substrate; forming a sacrificial layer on the first electrode layer; patterning the sacrificial layer to remove the sacrificial layer in a first region of the substrate and retain the sacrificial layer in a second region of the substrate, the first electrode layer is at least partially located in the first region; forming a first carrier auxiliary layer in the first region and the second region; forming a light-emitting layer on the first carrier auxiliary layer, the light-emitting layer is coupled with the first electrode layer via the first carrier auxiliary layer at least in the first region; and removing the retained sacrificial layer in the second region and the first carrier auxiliary layer and the light-emitting layer covering the retained sacrificial layer, and retaining the first carrier auxiliary layer and the light-emitting layer in the first region, to pattern the light-emitting layer.

In some embodiments, the method further comprises: after forming the first electrode layer on the substrate and before forming the sacrificial layer on the first electrode layer, forming a pixel definition layer on the substrate and the first electrode layer, the pixel definition layer comprises at least one pixel definition opening which at least partially exposes the first electrode layer, and the first region at least partially overlaps with the at least one pixel definition opening.

In some embodiments, the patterning the sacrificial layer comprises: forming a first photoresist layer on the sacrificial layer, exposing and developing the first photoresist layer to remove the first photoresist layer in the first region and retain the first photoresist layer in the second region, to form a first photoresist pattern, patterning the sacrificial layer using the first photoresist pattern to remove the sacrificial layer in the first region of the substrate; and the removing the retained sacrificial layer in the second region and the first carrier auxiliary layer and the light-emitting layer covering the retained sacrificial layer comprises: removing the first photoresist layer retained in the second region, together with the retained sacrificial layer in the second region and the first carrier auxiliary layer and the light-emitting layer covering the retained sacrificial layer.

In some embodiments, the patterning the sacrificial layer using the first photoresist pattern comprises: patterning the sacrificial layer by dry etching using the first photoresist pattern.

In some embodiments, the light-emitting layer is a quantum dot layer.

In some embodiments, the sacrificial layer is made of an organic material, and the organic material is one or more selected from the group consisting of: fluorene-based material, carbazole-based materials, perylene-based materials and aromatic acid-based materials.

In some embodiments, the organic material is one or more selected from the group consisting of: dibromoaminofluorene, dibromodimethylaminopropylfluorene, bromocarbazole, dialdehyde carbazole, hydroxycarbazole, aminonaphthalimide, polyvinylpyrrolidone, dihydroxyphenanthroline, dioctyltetracarboxydiimide, isopropylphenylperylenetetraformyldiimine, fullerenebenzoic acid, fullerenephosphoric acid, and p-ethylbenzoic acid.

In some embodiments, the removing the retained sacrificial layer located in the second region and the first carrier auxiliary layer and the light-emitting layer covering the retained sacrificial layer comprising: using an organic solvent to remove the retained sacrificial layer located in the second region and the first carrier auxiliary layer and the light-emitting layer covering the retained sacrificial layer, the organic solvent is one or more selected from the group consisting of alcoholic solvents.

In some embodiments, the alcoholic solvents are one or more selected from the group consisting of ethanol, propanol, iso-propanol, n-butanol, iso-butanol, n-pentanol, iso-pentanol, or any mixture thereof.

In some embodiments, the first electrode layer is a cathode layer, and the first carrier auxiliary layer is an electron transport layer.

In some embodiments, the cathode layer is an ITO layer, and the electron transport layer is a zinc oxide layer.

In some embodiments, the sacrificial layer has a thickness greater than a sum of a thickness of the first carrier auxiliary layer and a thickness of the light-emitting layer.

At least an embodiment of the present disclosure also provides a method of manufacturing a light-emitting diode device comprising: forming an element unit comprising the patterned light-emitting layer or a plurality of element units each comprising the patterned light-emitting layer by the method of patterning the light-emitting layer of any embodiment above.

In some embodiments, luminescent materials of the patterned light-emitting layers of the plurality of element units are different from each other.

In some embodiments, the method further comprises: forming a second carrier auxiliary layer and a second electrode layer on the element unit comprising the patterned light-emitting layer or each of the plurality of parallel element units comprising the patterned light-emitting layer.

BRIEF DESCRIPTION OF DRAWINGS

In order to clearly illustrate the technical solutions of the embodiments of the disclosure, hereinafter the drawings of the embodiments will be briefly described. It is apparent that the drawings as described below are only related to some embodiments of the disclosure, but are not limitative of the disclosure.

FIG. 2 is a schematically exploded view of a method of patterning a light-emitting layer according to another embodiment of the present disclosure.

FIG. 5B is a schematic view of a pixel definition layer formed in the embodiment as shown in FIG. 5A.

FIG. 6 is a flow chart of a method of manufacturing a light-emitting diode device according to an embodiment of the present disclosure.

DETAILED DESCRIPTION OF THE INVENTION

Figure 1:
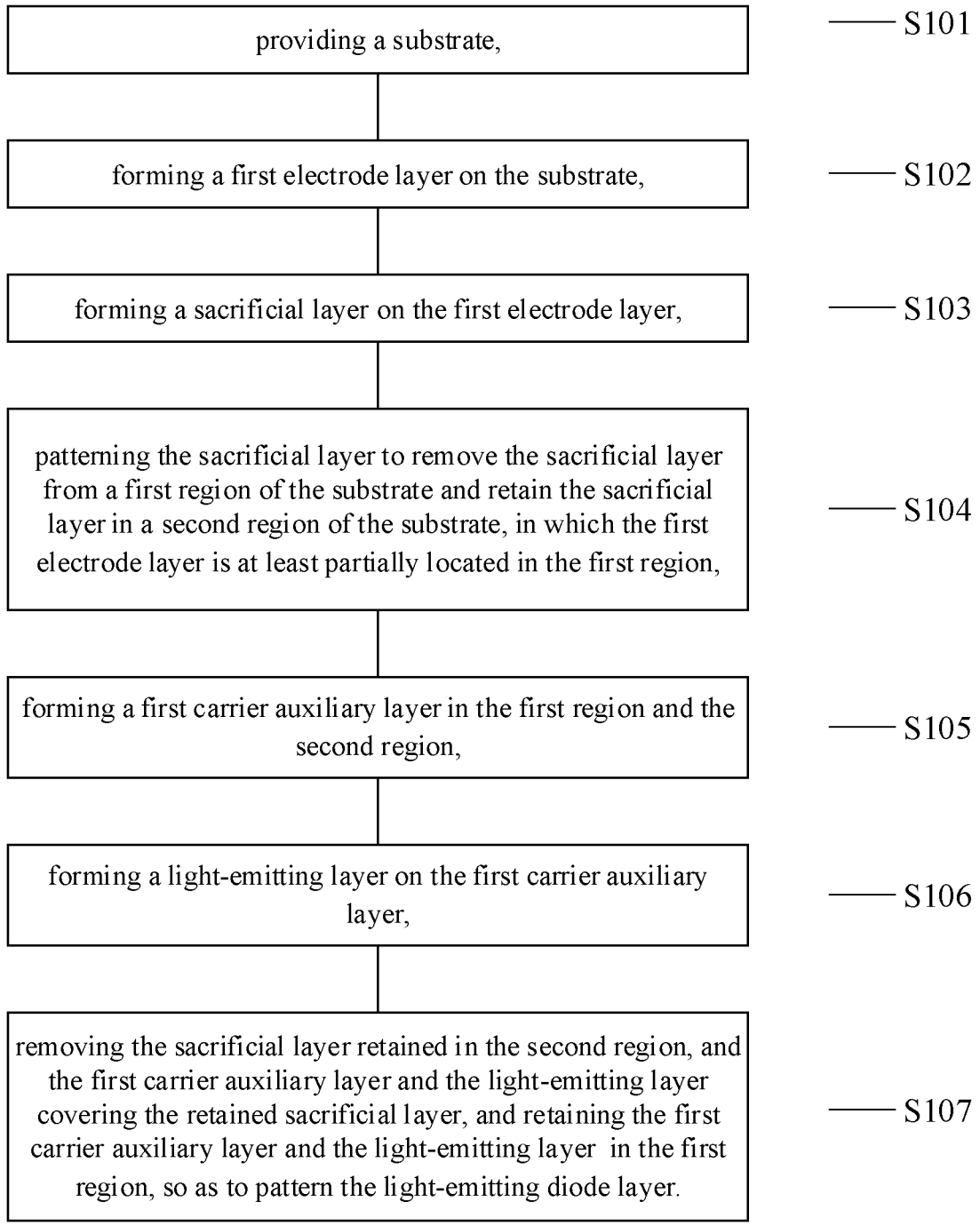
FIG. 1 is a flow chart of a method of patterning a light-emitting layer according to an embodiment of the present disclosure.

In order to make the objective, technical solution and advantages of embodiments of the present disclosure clearer, the technical solutions of the embodiments will be described in a clearly and fully understandable way in connection with the related drawings. It is apparent that the described embodiments are just a part but not all of the embodiments of the present disclosure. Based on the described embodiments herein, a person of ordinary skill in the art can obtain, without any inventive work, other embodiment(s) which should be within the scope of the present disclosure. The shapes and sizes of the parts in the drawings do not reflect the true proportions of the parts, but are merely illustrative of the present disclosure Unless otherwise defined, all the technical and scientific terms used herein have the same meanings as commonly understood by one of ordinary skill in the art to which the present disclosure belongs. The terms, such as "first," "second," or the like, which are used in the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the absolute position of the object which is described is changed, the relative position relationship may be changed accordingly.

For example, a light-emitting diode device generally comprises a first electrode, a pixel definition layer, an electron transport layer, a light-emitting layer, a hole transport layer, a hole injection layer, and a second electrode which are successively stacked; and as another example, a light-emitting diode device can further comprise an electron injection layer between the first electrode and the electron transport layer.

Under the action of the electric field generated by a voltage applied onto the first electrode and the second electrode, holes and electrons as carriers migrate and transfer in the hole transport layer and the electron transport layer, respectively, and combine to form excitons in the light-emitting layer and emit light.

The inventor notices that a patterned light-emitting layer can be manufactured by photolithography. Because the production of full-color devices requires the separation of red, green, and blue colors, it is required to achieve the patterning of the light-emitting layer.

At least an embodiment of the present disclosure provides a method of patterning a light-emitting layer, as well as a method of manufacturing a light-emitting diode device by the method of patterning the light-emitting layer.

At least an embodiment according to the present disclosure provides a method of patterning a light-emitting layer comprising: providing a substrate; forming a first electrode layer on the substrate; forming a sacrificial layer on the first electrode layer; patterning the sacrificial layer to remove the sacrificial layer from the first region of the substrate and retain the sacrificial layer in the second region of the substrate, the first electrode layer is at least partially located in the first region; forming a first carrier auxiliary layer in the first region and the second region; forming a light-emitting layer on the first carrier auxiliary layer, the light-emitting layer is coupled with the first electrode layer via the first carrier auxiliary layer in the first region; removing the sacrificial layer retained in the second region, and removing the first carrier auxiliary layer and the light-emitting layer covering the retained sacrificial layer, and retaining the first carrier auxiliary layer and the light-emitting layer in the first region, so as to pattern the light-emitting layer. At least an embodiment according to the present disclosure also provides a method of manufacturing a light-emitting diode device, comprising: forming an element unit comprising a patterned light-emitting layer or a plurality of parallel element units each comprising a patterned light-emitting layer by the above-described method of patterning the light-emitting layer. For example, the plurality of element units are parallel to, but separated from each other, or share the same first electrode layer.

For example, further, a second carrier auxiliary layer and a second electrode layer is further formed on the element unit or each of the plurality of element units, so as to obtain a light-emitting diode device or a plurality of light-emitting diode devices. The carrier transport characteristics of the second carrier auxiliary layer are opposite to the carrier transport characteristics of the first carrier auxiliary layer, e.g., one of them has the electron transport characteristic, while the other one has the hole transport characteristic.

For example, the plurality of light-emitting diode devices can emit light with the same color or emit light with different colors, for example, three light-emitting diode devices emit red, green, and blue light, respectively, so that various colors can be realized for use in various applications, such as color display, color light-emitting devices, etc.

In various embodiments of the present disclosure, the light-emitting layer can be organic light-emitting layers (OLEDs), or quantum dot light-emitting layers (QLEDs).

In various embodiments of the present disclosure, the first electrode layer formed on the substrate can be a cathode or an anode. In the case that the first electrode layer is a cathode, the first carrier auxiliary layer formed on the first electrode layer can be an electrode injection layer or an electron transport layer; and correspondingly, the second electrode layer is an anode, and the second carrier auxiliary layer is a hole injection layer or a hole transport layer. In the case that the first electrode layer is an anode, the first carrier auxiliary layer on the first electrode layer can be a hole injection layer or a hole transport layer; and correspondingly, the second electrode layer is a cathode, and the second carrier auxiliary layer is an electron injection layer or an electron transport layer.

Hereinafter, a plurality of embodiments of the present disclosure will be described with reference to the accompanying drawings, respectively; for simplicity, the following embodiments are illustrated by using the first electrode layer and the first carrier auxiliary layer as the cathode and the electron transport layer as examples, but the embodiments of the present disclosure are not limited to these examples.

FIG. 1 is a flow chart of a method of patterning a light-emitting layer provided in an embodiment of the present disclosure. As shown in FIG. 1, the method comprises the following steps.

Step S101: providing a substrate;
Step S102: forming a first electrode layer on the substrate;
Step S103: forming a sacrificial layer on the first electrode layer;
Step S104: patterning the sacrificial layer to remove the sacrificial layer from a first region of the substrate and retain the sacrificial layer in a second region of the substrate, in which the first electrode layer is at least partially located in the first region;
Step S105: forming a first carrier auxiliary layer in the first region and the second region;
Step S106: forming a light-emitting layer on the first carrier auxiliary layer;
Step S107: removing the sacrificial layer retained in the second region, as well as the first carrier auxiliary layer and the light-emitting layer covering the retained sacrificial layer, and retaining the first carrier auxiliary layer and the quantum dot layer of the light-emitting diode in the first region, so as to pattern the quantum dot light-emitting layer.

Hereinafter, FIG. 2 to FIG. 5 are referred to as examples for further description in details, but the present disclosure is not limited hereto. FIG. 2 is a schematically exploded view of a method of patterning a light-emitting layer according to an embodiment of the present disclosure.

As shown in FIG. 2, the method of patterning the light-emitting layer comprises:

Step S201: Providing a substrate 201.

In some embodiments, the substrate 201 can comprise rigid or flexible substrates. The rigid substrates can comprise glass substrates, ceramic substrates, plastic substrates, etc.; the flexible substrates can be plastic substrates (e.g., polyimide substrates), glass substrates, etc.; and a buffer layer, a circuit layer, etc. can be further formed on the rigid substrate or the flexible substrate. The disclosure is not limited thereto.

Step S202: Forming successively a first electrode layer 202, a sacrificial layer 203, and a photoresist layer 206 on the substrate 201.

For example, the first electrode layer 202 is a cathode. For example, the materials of the first electrode layer 202 can be those with low work function, for example, magnesium (Mg), calcium (Ca), indium (In), lithium (Li), aluminum (Al), silver (Ag), or their alloys or fluorides, such as magnesium-silver alloy, lithium-fluoride compound, lithium-oxide compound, etc. For example, the first electrode layer 202 can be an oxide conductive layer, for example, indium tin oxide (ITO) layer, indium zinc oxide (IZO) layer, etc.

For example, a conductive film for the first electrode layer 202 can be formed on the substrate 201 by a process, such as vacuum coating, evaporation, sputtering, physical or chemical vapor deposition, etc., and then it is patterned by a patterning process, so that a plurality of first electrode layers 202 separated from each other are obtained. The embodiments of the present disclosure are not limited thereto.

For example, the first electrode layer 202 can be provided either as a whole layer, or in a patterned manner.

Preferably, the first electrode layer 202 is provided in a patterned manner, and can be made in a one patterning process. Further preferably, the first electrodes in various light-emitting elements (i.e., the light-emitting sub-elements sequentially provided in the light-emitting layer of a light-emitting diode device) can be independently controlled, respectively, and thus the light-emitting intensities can be independently adjusted.

For example, the sacrificial layer 203 is made of an organic material. The organic material can be polymeric or small molecular materials which can form a uniform film, while functional layers like photoresist, developer of photoresist or others which can be subsequently applied thereto are not destructive to the film layer formed by the organic material.

For example, the organic material for forming the sacrificial layer 203 can be one or more selected from the group consisting of fluorene-based materials, carbazole-based materials, perylene-based materials, aromatic acid-based materials, or any combination. Further, for example, the organic material for the sacrificial layer 203 can be one or more selected from the group consisting:

For example, the photoresist layer 206 can be positive or negative photoresist that is compatible with the sacrificial layer. The disclosure is not limited thereof.

For example, the sacrificial layer 203 can be formed on the first electrode layer 202 by chemical vapor deposition or other similar processes, and then the photoresist layer 206 can be formed on the sacrificial layer 203 by coating (e.g., spin coating) or other similar processes. The disclosure is not limited thereof.

Step S203: Patterning the photoresist layer 206 to form a photoresist pattern comprising a photoresist-removing

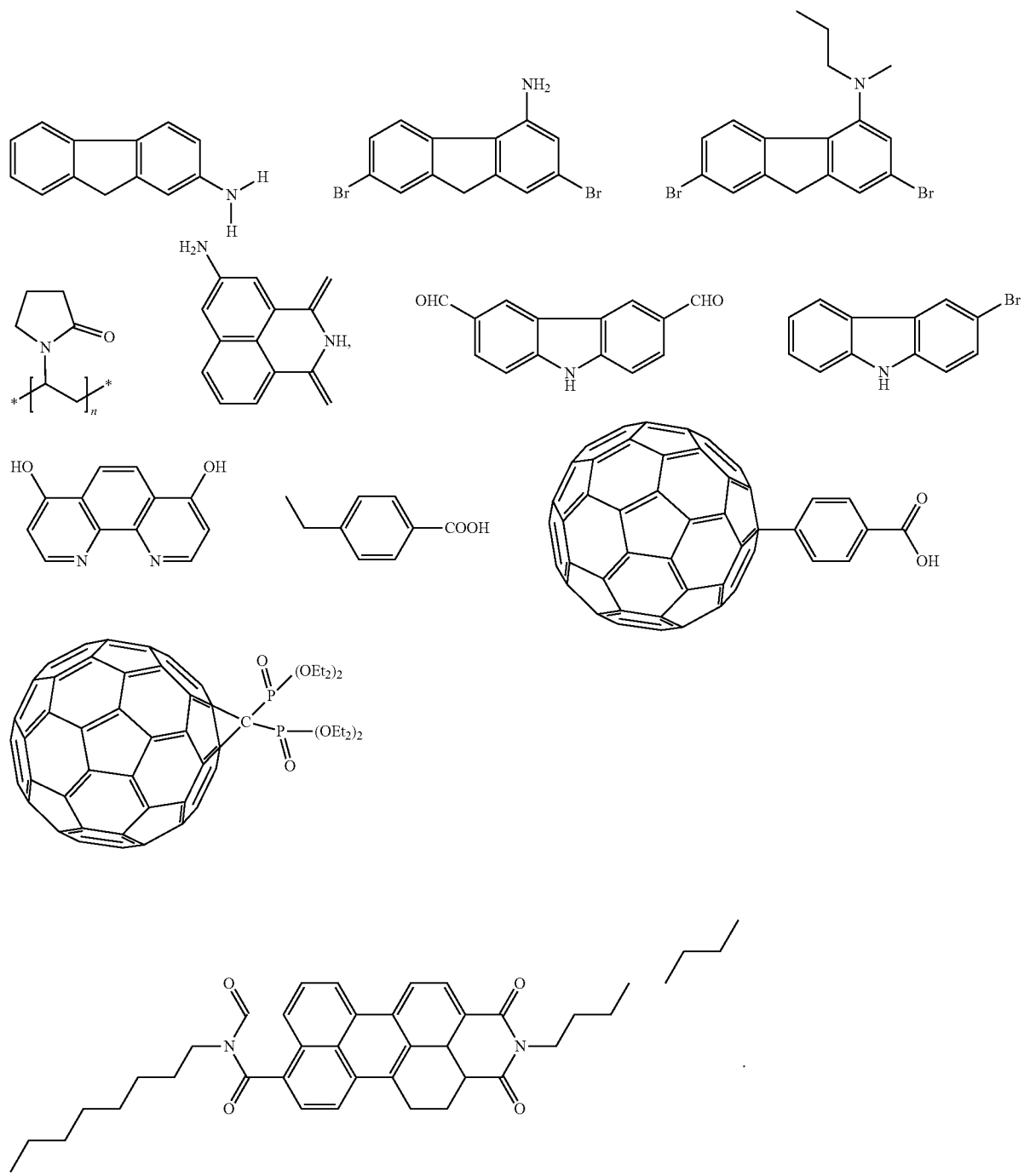

region 2031a exposing the underlying sacrificial layer 203 and a second region 2032 retaining the photoresist.

For example, the photoresist layer 206 can be patterned by sequential exposure and development. For example, the photoresist layer 206 can be patterned by exposing the photoresist layer 206 using a mask, and then developing to remove the exposed photoresist portion of the photoresist layer 206 so as to form the photoresist pattern. The photoresist pattern comprises the photoresist-removing region 2031a exposing the underlying sacrificial layer 203 and the second region 2032 retaining the photoresist.

Step S204: Removing the exposed portion of the sacrificial layer 203 in the photoresist-removing region 2031a to form the first region 2031 in which the sacrificial layer is removed, while retaining the photoresist layer and the sacrificial layer in the second region 2032.

For example, the removing the exposed portion of the sacrificial layer 203 in the photoresist-removing region 2031a can be performed by, e.g., the above-described photoresist pattern using etching or similar process. In the first region 2031, the first electrode layer underlying the sacrificial layer is exposed because the exposed sacrificial layer is removed; and the sacrificial layer in the second region 2032 is retained due to the presence of the photoresist, so that a sacrificial layer pattern is obtained.

For example, the exposed portion of the sacrificial layer 203 in the photoresist-removing region 2031a can be removed by dry etching or wet etching. Preferably, the exposed portion of the sacrificial layer 303 in the photoresist-removing region 3031a is removed by dry etching. For example, dry etching process, such as plasma etching, such as argon plasma etching, oxygen plasma etching, etc., can be used.

Step S205: Forming successively an electron transport layer 205 and a light-emitting layer 204 on the substrate 201.

In this example, the electron transport layer 205 and the light-emitting layer 204 are formed on the whole substrate 201; and in the first region 2031, the light-emitting layer 204 is coupled with the exposed first electrode layer 202 via the electron transport layer 205.

The material of the electron transport layer 302 can be zinc oxide (ZnO), magnesium oxide, magnesium zinc oxide, or titanium dioxide. In other embodiments, the electron transport layer can also be made of other suitable electron transport materials. The disclosure is not limited thereto. When the material of the electron transport layer 302 is ZnO, the preparation method can be film-forming by sputtering, vapor deposition, spin coating of ZnO nanoparticles, or any two of the above-described processes can be used to form two adjacent layers of ZnO, respectively.

In this example, the light-emitting layer 204 can be a quantum dot light-emitting diode (QLED) layer.

For example, the quantum dots can comprise silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, zinc sulfide quantum dots, indium phosphide quantum dots, indium arsenide quantum dots, etc., and the quantum dots can have a shape of sphere or spheroid with a particle size between 2 nm and 20 nm. The disclosure is not limited thereto.

The quantum dots material will emit light when stimulated by electricity or light, and the color of the emitted light is determined by the composition, size, and shape of the quantum dots. For example, for zinc sulfide (ZnS) quantum dots, the size of the red light-emitting quantum dots is primarily in a range of about 9 nm to 10 nm, the size of the yellow light-emitting quantum dots is about 8 nm, and the size of the green light-emitting quantum dots is about 7 nm.

For example, the forming the electron transport layer 205 and the light-emitting layer 204 in the first region 2031 can be independently carried out by coating, applying and/or vapor deposition. The disclosure is not limited thereof.

Step S206: Removing the photoresist layer 206 and the sacrificial layer 203 retained in the second region 2032, and retaining the electron transport layer and the light-emitting layer in the first region 2031, so as to obtain a patterned light-emitting layer.

For example, the photoresist layer 206 and the sacrificial layer 203 retained in the second region 2032 can be removed by lift-off process, together with the electron transport layer and the light-emitting layer on the photoresist layer 206 and the sacrificial layer 203 retained in the second region, but the electron transport layer and the light-emitting layer in the first region are retained.

For example, the lift-off process can be used to remove the retained photoresist layer and the sacrificial layer by dissolving with an organic solvent that does not damage the light-emitting layer. In at least an embodiment, the organic solvent that can be used to dissolve the photoresist layer and the sacrificial layer can be one or more selected from the group consisting of alcoholic solvents, e.g., one or more selected from the group consisting of ethanol, propanol, iso-propanol, n-butanol, iso-butanol, n-pentanol, iso-pentanol, or any mixture thereof.

In the embodiment as shown in FIG. 2, the thickness of the sacrificial layer 203 can be greater than a sum of the thickness of the electron transport layer 205 and the thickness of the light-emitting layer 204 so that it can contact the stripper during lifting-off so as to facilitate the lifting-off of the sacrificial layer from the photoresist layer. In the embodiment of patterning the light-emitting layer as shown in FIG. 2, the sacrificial layer and the photoresist layer are first formed on the first electrode layer, e.g., by patterning the photoresist layer and the sacrificial layer via exposure, development, and etching, and depositing the electron transport layer and the light-emitting layer on the formed structure, and then patterning the light-emitting layer, so as to obtain the light-emitting diode pattern.

In the embodiment as shown in FIG. 2, by using the sacrificial layer, a sacrificial layer pattern is obtained by etching the sacrificial layer, so as to obtain the patterned electron transport layer and the patterned light-emitting layer. In the method of patterning the light-emitting layer in this embodiment, e.g., the organic material for the sacrificial layer is directed deposited onto the first electrode layer (e.g., the ITO film layer) with good film-formability and structural stability, and thus during the subsequent etching process, the first electrode layer itself is not easily affected by etching, while it is easier to remove the sacrificial layer retained on the first electrode layer by dissolution in organic solvent after the formation of the light-emitting layer.

Figure 3:
FIG. 3 is a schematically exploded view of a method of patterning a light-emitting layer according to a comparative embodiment of the present disclosure.

FIG. 3 is a schematically exploded view of a method of patterning a light-emitting layer according to a comparative embodiment of the present disclosure, in which an electrode transport layer is first deposited on a first electrode; and then a sacrificial layer and a photoresist are successively formed on the electrode transport layer, and the sacrificial layer and the photoresist are patterned by exposure, development and etching; and a light-emitting layer is deposited on the formed structure, and then the light-emitting layer is patterned so as to obtain a light-emitting diode pattern.

As shown in FIG. 3, the method of patterning the light-emitting layer comprises following steps.

Step S301: providing a substrate 301.

Step S302: forming a first electrode layer 302 and an electron transport layer 305 on the substrate 301.

The material of the electron transport layer 302 can be zinc oxide (ZnO), magnesium oxide, magnesium zinc oxide, or titanium dioxide. In other embodiments, the electron transport layer can also be made of other suitable electron transport materials. The disclosure is not limited thereto. When the material of the electron transport layer 302 is ZnO, the preparation process can be film-forming by sputtering, vapor deposition, spin coating of ZnO nanoparticles, or any two of the above-described processes can be used to form two adjacent layers of ZnO, respectively.

For example, the first electrode layer 302 can be provided either as a whole layer, or in a patterned manner.

Preferably, the first electrode layer 302 is provided in a patterned manner, and can be made in a one patterning process. Further preferably, the first electrodes in various light-emitting elements can be independently controlled, respectively, and thus the light-emitting intensities can be independently adjusted. It can be understood that in the case that the first electrode layer 302 is provided in a patterned manner, the electron transport layer 305 also needs to be provided in a patterned manner, and the pattern of the electrode transport layer 305 exactly correspond to the pattern of the first electrode. The electron transport materials corresponding to various light-emitting elements are provided independently of each other.

Step S303: forming successively a sacrificial layer 303 and a photoresist layer 306 on the electron transport layer 305;

Step S304: patterning the photoresist layer 306 to form a photoresist pattern comprising a photoresist-removing region 3031a exposing the underlying sacrificial layer 303 and a second region 3032 retaining the photoresist;

Step S305: removing the exposed portion of the sacrificial layer 303 in the photoresist-removing region 3031a to form the first region 3031 in which the sacrificial layer is removed, while retaining the photoresist layer and the sacrificial layer in the second region 3032;

For example, the exposed portion of the sacrificial layer 303 in the photoresist-removing region 3031a can be removed by dry etching or wet etching. Preferably, the exposed portion of the sacrificial layer 303 in the photoresist-removing region 3031a is removed by dry etching. For example, dry etching process, such as plasma etching, such as argon plasma etching, oxygen plasma etching, etc., can be used.

Step S306: forming a light-emitting layer 304 on the substrate 301;

Step S307: Removing the photoresist layer 306 and the sacrificial layer 303 retained in the second region 3032, while retaining the light-emitting layer in the first region 2031, so as to obtain a patterned light-emitting layer.

The substrate, the first electrode layer, the light-emitting layer, the electron transport layer, the sacrificial layer, the photoresist layer, and their formation processes and/or patterning/photoetching/etching processes used in the comparative embodiment as shown in FIG. 3 are the same as those of the embodiment as shown in FIG. 2, which are not repeated herein.

In the embodiment as shown in FIG. 2, a patterned light-emitting layer is formed on the substrate, and a stack structure of the patterned light-emitting layer and the electron transport layer are formed on the substrate, the stack structure is an element unit for forming light-emitting element subsequently. Furthermore, in the embodiment as shown in FIG. 2, a single stack structure of the light-emitting layer and the electron transport layer is formed. By repeating the corresponding steps, a plurality of (two or more) stack structures (i.e., a plurality of element units) can be obtained, the plurality of stack structures are separated by a predetermined distance from each other and used for forming a plurality of light-emitting elements subsequently. Hereinafter, the example of the formation of a plurality of element units is illustrated by reference to the accompanying drawings.

Figure 4:
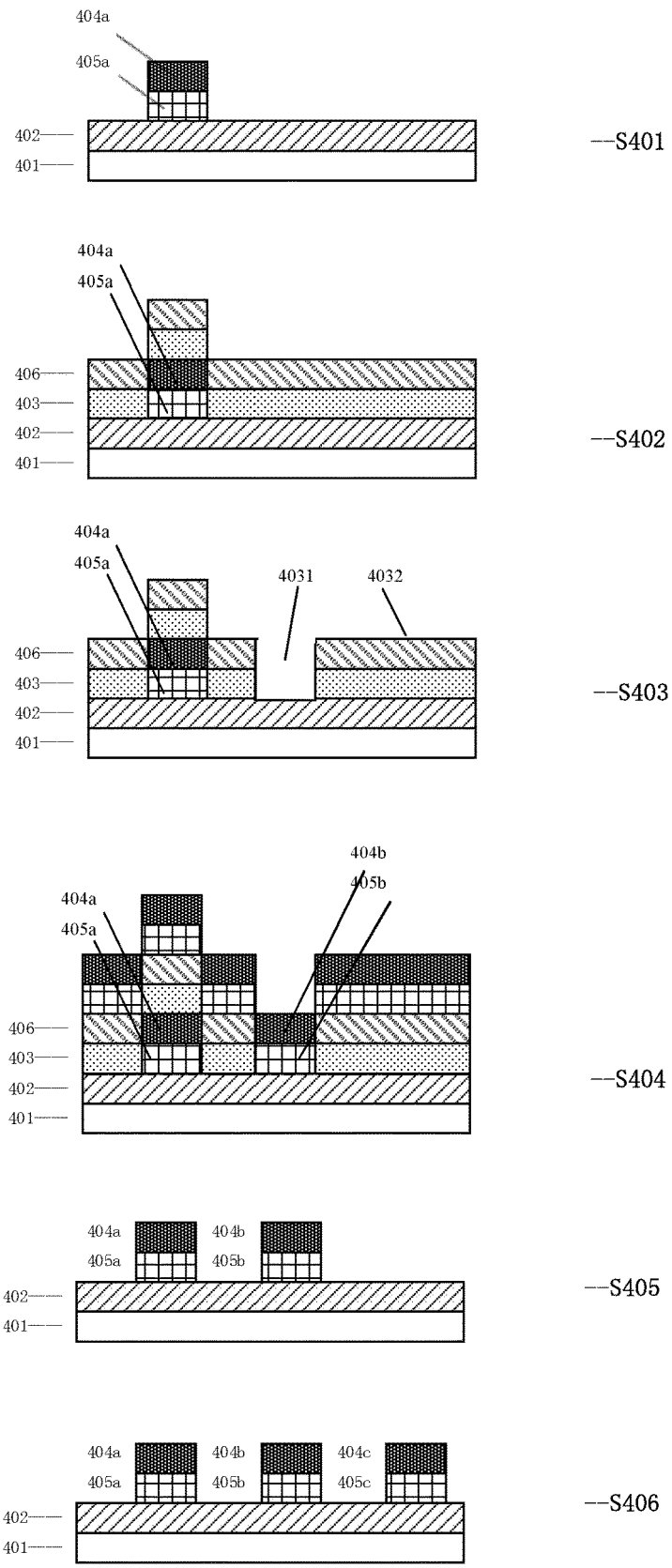
FIG. 4 is a schematically exploded view of a method of patterning a light-emitting layer according to yet another embodiment of the present disclosure.

FIG. 4 shows a schematically exploded view of a method of patterning a light-emitting layer according to yet another embodiment of the present disclosure, which is based on the embodiment as shown in FIG. 2 to give a plurality of element units. As shown in FIG. 4, the method of patterning the light-emitting layer comprises the following steps.

Step S401: Forming a patterned first light-emitting layer 404a by the method of patterning the light-emitting layer provided in the embodiment as shown in FIG. 2; and with regard to the patterned first light-emitting layer, a first electrode layer 402 and a first electron transport layer 405a are formed on the substrate 401, and the first electron transport layer 405a is also patterned and has substantially the same pattern as that of the first light-emitting layer 404a.

As shown in the figure, the first electron transport layer 405a and the first light-emitting layer 404a form a stack structure, the first electrode layer 402 is on the substrate 401 and extends to other regions beyond the above-described stack structure. In another example (not shown), the first electrode layer 402 in the other regions beyond the stack structure and the first electrode layer 402 under the stack structure are separated from each other, for example, the two first electrode layers are insulated from each other.

Step S402: Forming successively a sacrificial layer 403 and a photoresist layer 406 on the substrate 401 having the patterned first light-emitting layer 404a formed thereon.

The formed sacrificial layer 403 and the photoresist layer 406 cover the above-described stack structure of the first electron transport layer 405a and the first light-emitting layer 404a, and cover the other regions beyond the stack structure.

Step S403: Patterning the photoresist layer 406 to form a photoresist pattern, and patterning the sacrificial layer 403 with the photoresist pattern to remove the sacrificial layer beyond the region in which the stack structure of the first electron transport layer 405a and the first light-emitting layer 404a is formed to form a first region 4031 exposing the underlying first electrode layer 402, and retain the photoresist layer 406 and the sacrificial layer 403 in a second region 4032 different from the first region 4031.

In this way, the first electron transport layer 405a and the first light-emitting layer 404a are not located in the first region 4031.

Step S404: Forming a second electron transport layer 405b and a second light-emitting layer 405b on the substrate 401.

For example, the light-emitting material of the second light-emitting layer 405b is different from the light-emitting material of the first light-emitting layer 404a, e.g., they emit light with different colors upon connecting to a power supply. In the first region 4031, the second light-emitting layer 405b is connected to the first electrode layer 402 via the second electron transport layer 406b.

For example, the material of the second electron transport layer 405b and the material of the first electron transport layer 405a are the same or different, e.g., they can be zinc oxide, magnesium oxide, magnesium zinc oxide, or titanium dioxide; and for example, the thickness of the second electron transport layer 405b and the thickness of the first electron transport layer 405a are the same or different.

Step S405: Removing the photoresist layer 406 and the sacrificial layer 403 retained in the second region 4032, to form a second patterned second electron transport layer 405b and a second patterned second light-emitting layer 404b.

For example, the photoresist layer 406 and the sacrificial layer 403 retained in the second region can be removed by a lift-off process together with the second electron transport layer and the second light-emitting layer of the photoresist layer 406 and the sacrificial layer 4034 retained in the second region, but the second electron transport layer 405b and the second light-emitting layer 404b are retained in the first region, and the second electron transport layer 405b and the second light-emitting layer 404b form a stack structure in the first region.

Step S406: Repeating S402-S405 to form a third patterned third electron transport layer 405c and a third patterned third light-emitting layer 404c.

The third light-emitting layer 404c and the third electron transport layer 405c are stacked on the first electrode layer 402, and the third light-emitting layer 404c is coupled with the first electrode layer 402 via the third electron transport layer 405c. The region in which the stack structure formed by the third light-emitting layer 404c and the third electron transport layer 405c is located is different from the two regions in which the first light-emitting layer 404a and the second light-emitting layer 404b are located, respectively. The portion of the first electrode layer 402 corresponding to the stack structure of the third light-emitting layer 404c and the third electron transport layer 405c and the portions of the first electrode layer 402 corresponding respectively to the first light-emitting layer 404a and the second light-emitting layer 404b are connected with each other, or separated from each other.

For example, the light-emitting material of the third light-emitting layer 404c is different from the light-emitting materials of the first light-emitting layer 404a and the second light-emitting layer 404b, e.g., they emit light with different colors upon connecting to power supplies.

For example, the material of the third electron transport layer 405c and the material(s) of the first electron transport layer 405a and/or the second electron transport layer 405b are the same or different, e.g., they can be zinc oxide, magnesium oxide, magnesium zinc oxide or titanium dioxide; and for example, the thickness of the third electron transport layer 405c and the thickness of the second electron transport layer 405b and/or the thickness of the first electron transport layer 405a are the same or different.

In the method of patterning the light-emitting layer provided in the embodiment as shown in FIG. 4, various electron transport layers, various sacrificial layers, various photoresist layers, and their formation processes and/or patterning/photoetching/etching processes are the same as those of the embodiment as shown in FIG. 2, which are not repeated herein.

In the method of patterning the light-emitting layer provided in the embodiment as shown in FIG. 4, as described above, e.g., the materials of the first light-emitting layer, the second light-emitting layer, and the third light-emitting layer are different from each other, e.g., they can be independently selected from the group consisting of silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, and indium arsenide quantum dots, etc. For example, the first light-emitting layer, the second light-emitting layer, and the third light-emitting layer can emit red light, green light, and blue light, respectively, upon connecting to power supplies so that they can be used in a full color light-emitting layer comprising red pixels, green pixels, and blue pixels of a display device.

It can be understood that when the materials of the first light-emitting layer, the second light-emitting layer and the third light-emitting layer are different from each other, the first electrode layer 402 is provided in a patterned manner so that the first electron transport layer 405a, the second electron transport layer 405b, and the third electron transport layer 405c cannot conduct with each other via the first electrode layer 402, so as to achieve the effect of controlling the light-emitting intensities of different light-emitting elements, respectively.

It can be understood that more types of element units of which the materials are different from those of the first light-emitting layer, the second light-emitting layer, and the third light-emitting layer can be produced by the method as shown in FIG. 4.

In other embodiments, a plurality of element units can be obtained based on the method of the example as shown in FIG. 3, and the particular method is similar to the method as shown in FIG. 4. It is to be noted that, in the example as shown in FIG. 3, the electron transport layer is not patterned along with the light-emitting layer, but can be patterned after the formation of the first electrode layer; in this way, the electron transport materials of the plurality of element units can be formed in the same layer, while the light-emitting layers of the plurality of element units are formed respectively.

Figure 5A:
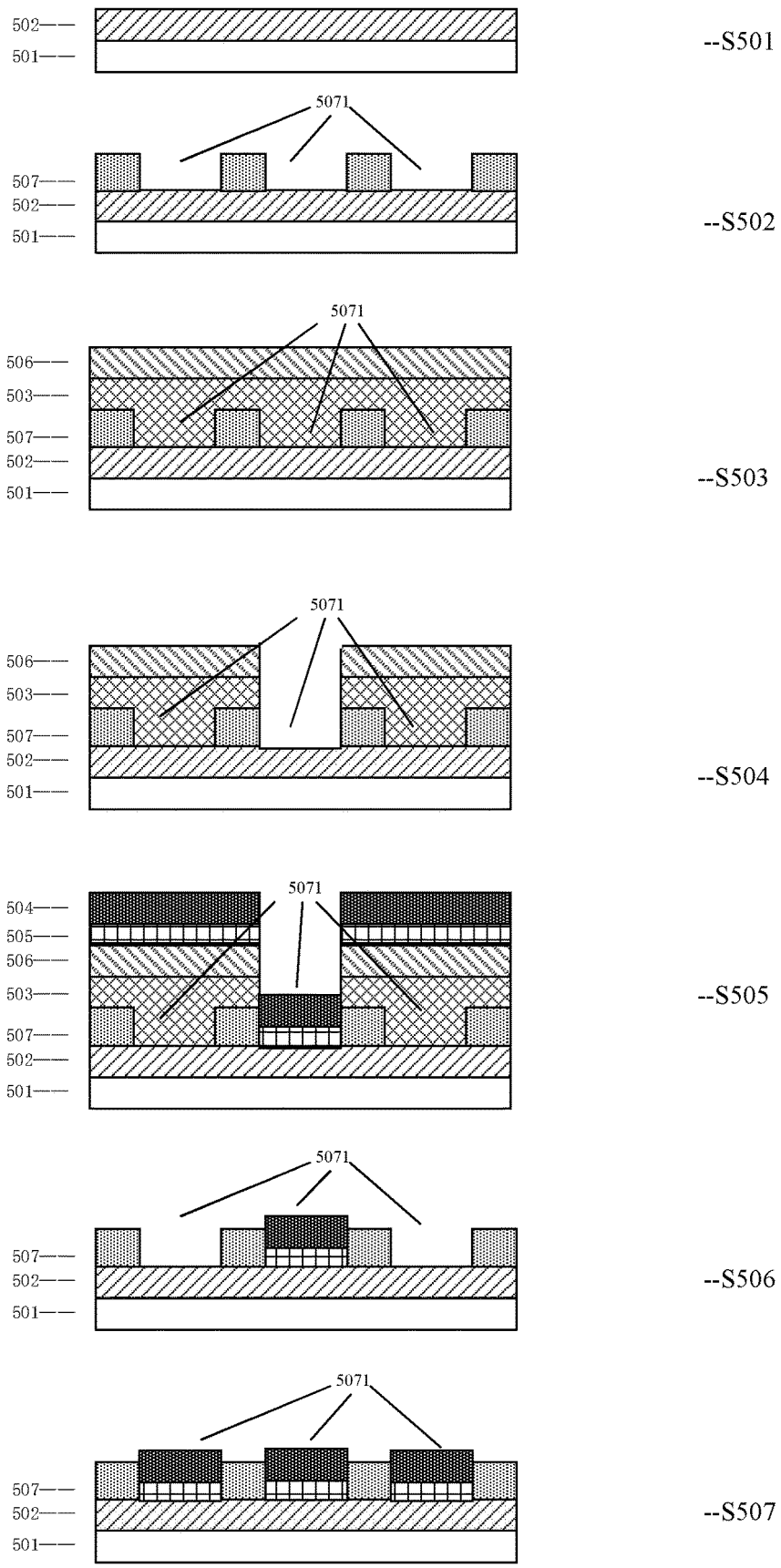
FIG. 5A is a schematically exploded view of a method of patterning a light-emitting layer according to still another embodiment of the present disclosure.

FIG. 5A shows a schematically exploded view of the method of patterning the light-emitting layer according to still another embodiment of the present disclosure, and FIG. 5B shows a schematic view of the pixel definition layer formed in the embodiment as shown in FIG. 5A. The method of patterning the light-emitting layer as shown in the embodiment of FIG. 5A is based on the example as shown in FIG. 2, and thus the same aspects are not repeated. As shown in FIG. 5, the method of patterning the light-emitting layer comprises the following steps.

Step S501: providing a substrate 501 and forming a first electrode layer 502 on the substrate 501.

Step S502: forming a pixel definition layer 507 on the first electrode layer 502.

The pixel definition layer 507 comprises at least one pixel definition opening 5071, e.g., the pixel definition layer 507 comprises a plurality of pixel definition openings 5071. For example, the plurality of pixel definition openings 5071 correspond to a plurality of pixel units in the pixel array of the array substrate. FIG. 5B shows the pixel definition layer 507 comprising six (2 rows×3 columns) pixel definition openings 5071, but the embodiments of the present disclosure are not limited thereto. Each pixel definition opening 5071 exposes at least a portion of the first electrode layer 502.

For forming the pixel definition layer 507, an insulating film can be first formed on the substrate 501 with the first electrode layer 502, and then the insulating film is patterned by, e.g., a patterning process like photoetching process, to form one or more pixel definition openings 5071.

The material of the pixel definition layer 507 comprises an inorganic insulating material or an organic insulating material, and the embodiments of the present disclosure are not limited thereto. For example, the inorganic insulating material comprises oxides, nitrides, oxynitrides, etc, such as silicon oxide, silicon nitride, silicon oxynitride, etc. For example, the organic insulating material comprises polyimides, polyphthalimides, polyphthalamides, acrylic resins, benzocyclobutenes, or phenolic resins, etc.

Step S503: forming successively a sacrificial layer 503 and a photoresist layer 506 on the substrate 501.

The sacrificial layer 503 and the photoresist layer 506 are successively formed on the substrate 501, and the stack of the sacrificial layer 503 and the photoresist layer 506 cover the pre-formed first electrode layer 502 and the pre-formed pixel definition layer 507, and are formed in the pixel definition opening 5071 of the pixel definition layer 507.

Step S504: Patterning the photoresist layer 506 to form a photoresist pattern, and patterning the sacrificial layer 503 with the photoresist pattern to form a sacrificial layer pattern.

For example, the photoresist layer 506 can be patterned by sequential exposure and development to form the photoresist pattern. The photoresist pattern comprises the photoresist-removing region exposing the underlying sacrificial layer 503 and the second region retaining the photoresist. The exposed portion of the sacrificial layer 503 in the photoresist-removing region is removed by etching to form the first region in which the sacrificial layer is removed, while retaining the photoresist layer and the sacrificial layer in the second region.

The first region corresponds to e.g., one pixel definition opening 5071, e.g., both of them at least partially overlap so that the exposed first electrode layer 502 in the pixel definition opening 5071 is exposed by the resulted sacrificial layer pattern. Or, the first region completely overlap with, e.g., one pixel definition opening, e.g., the pixel definition opening is completely located in the first region.

Step S505: Forming successively an electron transport layer 505 and a light-emitting layer 504 on the substrate 501.

In this example, the electron transport layer 505 and the light-emitting layer 504 are formed on the whole substrate 501; and in the pixel definition opening 5071 corresponding to the first region, the light-emitting layer 504 is coupled with the exposed first electrode layer 502 via the electron transport layer 505.

Step S506: Removing the photoresist layer 506 and the sacrificial layer 503 retained in the second region, and retaining the electron transport layer and the light-emitting layer in the first region, so as to obtain a patterned light-emitting layer.

For example, the photoresist layer 506 and the sacrificial layer 503 retained in the second region can be removed by a lift-off process, together with the electron transport layer and the light-emitting layer on the photoresist layer 506 and the sacrificial layer 503 retained in the second region, but the electron transport layer and the light-emitting layer in the first region are retained so that the electron transport layer and the light-emitting layer are retained in the pixel definition opening 5071.

Step S507: Repeating Step S503 to Step S505 to form more patterned light-emitting layers which are at least partially located in different pixel definition openings 5071.

In this way, a plurality of (two or more) stack structures (i.e., a plurality of element units) can be obtained, which are separated by a predetermined distance from each other via the pixel definition layers and used for subsequent formation of a plurality of light-emitting elements.

For example, the materials of the light-emitting layers of the plurality of light-emitting elements formed in various steps are different from each other, and used to emit red light, green light, and blue light, respectively, upon connecting to power supplies, so that they can be used in a full color light-emitting layer comprising red pixels, green pixels, and blue pixels of a display device.

At least an embodiment of the present disclosure also provides a method of manufacturing a light-emitting diode device, comprising forming a light-emitting diode device based on the element unit(s) formed in the above embodiments.

As shown in FIG. 6, the method of manufacturing the light-emitting diode device comprises forming a patterned light-emitting layer or a plurality of (e.g., three) independent patterned light-emitting layers by the method of patterning the light-emitting layer of the embodiments as shown in any one of FIGS. 2-5, and the patterned light-emitting layer or the plurality of patterned light-emitting layers are coupled with the first electrode layer via the electron transport layer; forming successively a hole transport layer and a hole injection layer on the patterned light-emitting layer or each of the plurality of the patterned light-emitting layers; and then forming a second electrode layer on the hole injection layer.

In this embodiment, in the case that a plurality of patterned light-emitting layers are formed, the plurality of portions of the formed second electrode layer corresponding to the plurality of patterned light-emitting layers can be connected with each other, or can be separated from each other (i.e., they are insulated from each other).

For example, the material of the hole transport layer can be an organic hole transport material. For example, the organic hole transport material can be any electron-rich aromatic hole material that are known by persons skilled in the art, such as poly(p-phenylene vinylenes) (PPVs), polythiophenes, polysilanes, triphenylmethanes, triarylamines, hydrozones, pyrazolines, oxazoles, carbozoles, butadienes, etc. The present disclosure is not limited thereto.

For example, the material of the hole injection layer can comprise, e.g., star-shaped triphenylamine compounds, metal complexes, polyanilines, fluorinated hydrocarbons, Porphyrin derivatives, P-Doped amine derivatives, poly(3,4-vinyldihydrothiophene)-polystyrenesulfonates (PEDOT/PSS), polythiophenes, or polyphenylamines. The disclosure is not limited thereto.

For example, the hole injection layer and the hole transport layer can be formed by, e.g., vacuum evaporation, coating, chemical vapor deposition, or similar methods. The disclosure is not limited thereof.

In at least an embodiment of the present disclosure, the first carrier transport layer can comprise an electrode injection layer, or a stack structure of an electrode injection layer and an electron transport layer, and in the stack structure, the electron transport layer is located between the electrode injection layer and the light-emitting layer. For example, the electrode injection layer and the electron transport layer of the stack structure is patterned together or separately.

For example, in some embodiments, the material of the electrode injection layer can comprise alkali metal halides, alkali earth metal halides, alkali metal oxides, metal carbonates, metal complex materials, oxadiazole-based materials, imidazole-based materials, phenanthroline derivatives, etc. The disclosure is not limited thereto.

As shown in FIG. 2 and FIG. 3, the method of embodiment as shown in FIG. 2 further forms a patterned electron transport layer which has the same pattern as that of the light-emitting layer; while in the method of the comparative embodiment as shown in FIG. 3, the electron transport layer is not patterned, but is continuously formed between the first electrode layer and the light-emitting diode.

Figure 7:
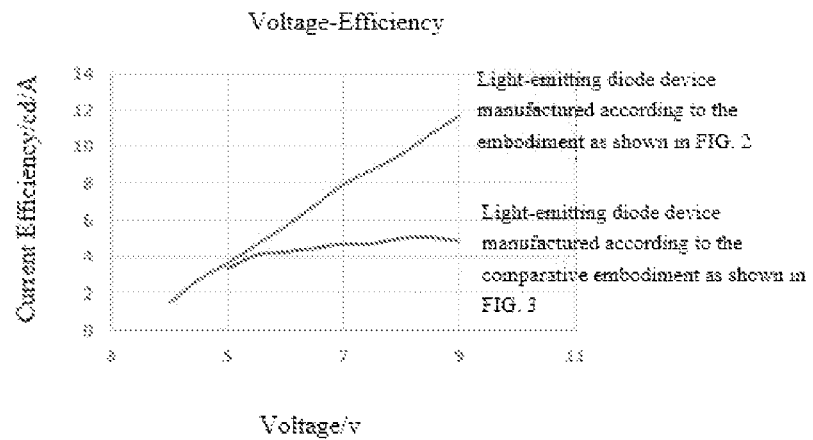
FIG. 7 is a performance comparison diagram between a light-emitting device with a patterned light-emitting layer obtained by the method of patterning the light-emitting layer of the embodiment as shown in FIG. 2 and a light-emitting device with a patterned light-emitting layer obtained by the method of patterning the light-emitting layer of the comparative embodiment as shown in FIG. 3.

FIG. 7 shows a performance comparison diagram between a red QLED device patterned by the method of the embodiment as shown in FIG. 2 and a red QLED device patterned by the method of the comparative embodiment as shown in FIG. 3. In FIG. 3, in the red QLED device patterned by the method of the embodiment as shown in FIG. 2, the material of the first electrode layer 302 is ITO, the material of the electron transport layer 305 is ZnO, the exposed portion of the sacrificial layer 203 is removed by dry etching. In the comparative embodiment, the material of the first electrode layer 302 is ITO, the material of the electron transport layer 305 is ZnO, the exposed portion of the sacrificial layer 303 is removed by dry etching. As shown in FIG. 3, with the increasing of the voltage, the current efficiency of the red QLED device patterned by the method of the embodiment as shown in FIG. 2 is significantly greater than the current efficiency of the red QLED device patterned by the method of the comparative embodiment as shown in FIG. 3. The reason for the above difference in current efficiency relies on that the over etching occurring during dry etching of sacrificial layer 303 in the comparative embodiment will damage ZnO, resulting in the decline of device performance, so that the device lighting voltage increases, the efficiency decreases, and the pixel morphology deteriorates. However, in the red QLED device patterned by the method of the embodiment as shown in FIG. 2, the sacrificial layer 203 is in direct contact with ITO, and the ITO below the sacrificial layer 203 is not easy to be damaged because the ITO film has good film formation and stable structure. In this way, the over etching has less impact on ITO than that on ZnO film, and the performance of the fabricated device will not be greatly affected. It can be understood that when magnesium oxide, magnesium zinc oxide or titanium dioxide is used as the material of the electron transport layer, the over etching during dry etching will also damage it in some extent. In this way, the light-emitting diode device patterned by the method of the embodiment as shown in FIG. 2 can have better device performance, as compared with the light-emitting diode device patterned by the method of the comparative embodiment as shown in FIG. 3.

Figure 8:
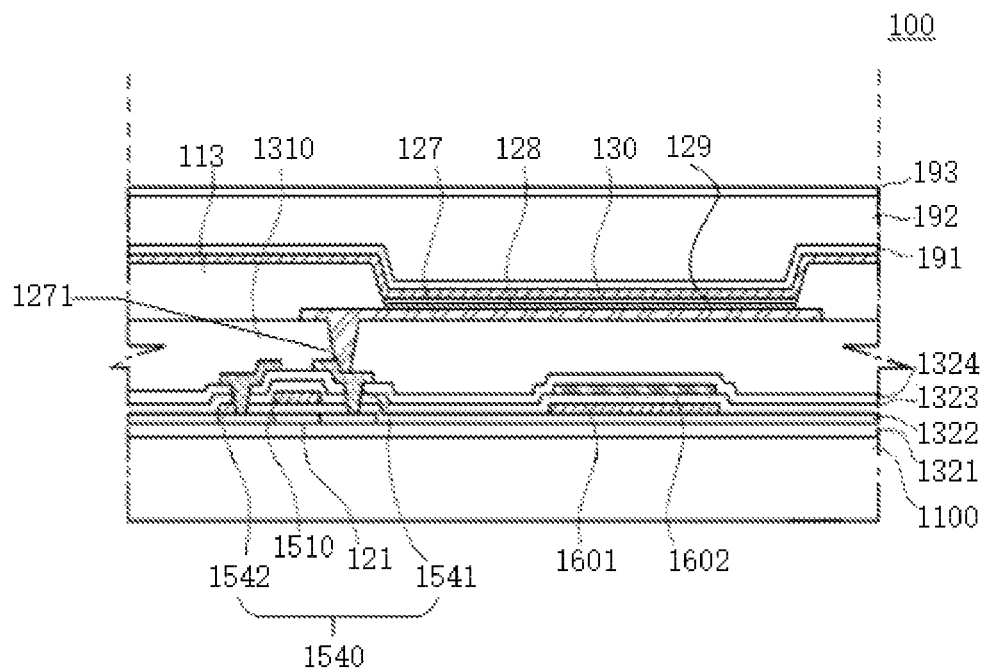
FIG. 8 is a cross-sectional view of a light-emitting diode device according to an embodiment of the present disclosure.

FIG. 8 is a sectional view of a light-emitting diode device 100 according to an embodiment of the present disclosure, the light-emitting diode device 100 is disposed on an array substrate comprising a pixel circuit for driving the quantum dot device 100. As shown in FIG. 8, e.g., in at least one embodiment of the present disclosure, a buffer layer 1321 is disposed on the substrate 1100 to provide a flat surface for forming the pixel circuit and avoid impurities that can be present in the substrate from diffusing into the pixel circuit to adversely affecting the performance of the pixel circuit.

For example, the material of the buffer layer 1321 can comprise an insulating materials, such as silicon oxide, silicon nitride, silicon oxynitride, etc.

As shown in FIG. 8, the semiconductor layer 121 of the thin film transistor for direct connecting with the light-emitting element in the pixel circuit is disposed on the buffer layer 1321. The semiconductor layer 121 can comprise polycrystalline silicon or oxide conductors. For example, the semiconductor layer 121 comprises a channel region which is not doped with impurities, and a source region and a drain region doped with impurities (n-type impurities or p-type impurities) located on opposite sides of the channel region.

As shown in FIG. 8, the first gate insulating layer 1322 is disposed on the semiconductor layer 121. The gate electrode 1510 and the first capacitance electrode 1601 are disposed on the first gate insulating layer 1322. The gate electrode 1510 overlaps with the semiconductor layer 121. The gate electrode 1510 and the first capacitance electrode 1601 are made from the same materials and are provided in the same layer.

As shown in FIG. 8, the second gate insulating layer 1323 is disposed on the gate electrode 1510 and the first capacitance electrode 1601, and the second capacitance electrode 1602 is disposed on the second gate insulating layer 1323. The second capacitor electrode 1602 and the first capacitor electrode 1601 are disposed in overlapping manner, and they are at least partially overlapped with each other in a direction perpendicular to the substrate 1100. The first capacitor electrode 1601 and the second capacitor electrode 1602 use the second gate insulating layer 1323 as a dielectric material to form a storage capacitor.

As shown in FIG. 8, the interlayer insulating layer 1324 can be disposed on the second capacitor electrode 1602, and the source and drain electrode layers 1540 can be disposed on the interlayer insulating layer 1324. The source and drain electrode layers 1540 of the thin film transistor comprises a drain electrode 1541 and a source electrode 1542. The drain electrode 1541 and the source electrode 1542 can comprise a single-layer or multilayer layer which can be formed by molybdenum, aluminum, titanium, etc.

In this embodiment, the thin film transistor in the array substrate can be a top gate thin film transistor as shown in FIG. 7, or it can be a bottom gate thin film transistor, a double-gate thin film transistor or other types of thin film transistors, which is not limited in this embodiment.

As shown in FIG. 8, the first insulating layer 1310 covers the thin film transistor and forms a quantum dot device 100 thereon. The first insulating layer 1310 as a planarization layer can comprise an organic insulating material or an inorganic insulating material, or can be formed by a combination of an organic insulating material and an inorganic insulating material.

As shown in FIG. 8, the pixel electrodes 127 (the aforementioned example of the first electrode layer) are separately formed in each sub-pixel on the first insulating layer 1310 as a planarization layer, and are connected to the drain electrode 1542 of the thin film transistor through a via hole 1271 formed on the first insulating layer 1310.

The pixel definition layer 113 is disposed on the first insulating layer 1310, and comprises a pixel definition opening to expose a majority of the pixel electrodes 127. The electron transport layer 128 is disposed on the pixel electrode 127, the light-emitting layer 129 is disposed on the electron transport layer 128, and the stack structure of the electron transport layer 128 and the light-emitting diode 129 is disposed in the pixel definition opening.

For example, the material of the pixel electrode 127 can comprise at least one transparent conductive oxide material including indium tin oxide (ITO), indium zinc oxide (IZO), zinc oxide (ZnO), etc.

The hole transport layer 130 is formed on the light-emitting layer 129 and the pixel definition layer 113; and a common electrode 191 (an example of the aforementioned second electrode layer) is formed on the hole transport layer 130.

The pixel electrode 127, the electron transport layer 128, the light-emitting layer 129, the hole transport layer 130, and the common electrode 191 together constitute a light-emitting diode device.

For example, as shown in FIG. 8, the organic packaging layer 192 and the inorganic packaging layer 193 are successively disposed on the common electrode 191.

The material of the organic packaging layer can be desiccant-containing polymer materials or vapor-blocking polymer materials, such as polymer resins, etc. to flatten the surface of the display substrate, and to relieve the stress of the inorganic packaging layer, and the desiccant or other water absorbent materials can adsorb water, oxygen and other substances invading the interior.

Hereinafter a specific example of the embodiments of the present disclosure is described with reference to FIG. 6, but the present disclosure is not limited to the specific example as below.

First, an ITO layer is formed on a glass substrate, cleaned with water and ethanol, and then dried and treated with UV ozone for 10 minutes.

A 15 mg/ml solution of polyvinylpolypyrrolidone in ethanol is spin-coated on the ITO conductive layer. After the spin coating, it is air dried for 5-10 minutes to obtain a polyvinylpyrrolidone film, that is, the sacrificial layer. It can be understood that the thickness of the sacrificial layer can be adjusted by the concentration of the solution of polyvinylpyrrolidone in ethanol, which can be 10 mg/ml, 15 mg/ml, 20 mg/ml, 30 mg/ml, or the like, and the thickness of the sacrificial layer can be in a range of 30 nm to 300 nm. It can be understood that the thickness of the sacrificial layer can be adjusted as required. Preferably, the thickness of the sacrificial layer is greater than a sum of the thicknesses of the electron transport layer and the quantum dot layer which are subsequently formed, so that it can contact the stripper during lifting-off so as to facilitate the lifting-off of the sacrificial layer from the photoresist layer. On the other hand, the sacrificial layer should not be too thick, otherwise the sacrificial layer is easy to deform in the subsequent etching step, which will affect the preparation effect of the device.

A negative photoresist is spin coated onto the polyvinylpyrrolidone film. The negative photoresist layer is exposed with a mask, and then developed with p-xylene for 90 seconds to give a photoresist pattern. The photoresist pattern exposes the portion of the sacrificial layer which is needed to be removed by etching, and protects the portion of the sacrificial layer which is not need to be removed by etching.

An etching process with oxygen plasma is performed for 6 seconds to remove the portion of the sacrificial layer exposed by the photoresist pattern, and correspondingly exposes the underlying ITO conductive layer. Then, the electron transport layer of zinc oxide and a red quantum dot layer are spin coated onto the glass substrate.

The sacrificial layer-retained portion and the retained photoresist is soaked with pentanol (ultrasonic can be selected if necessary to speed up the lifting-out speed, and the time can be selected as 6 minutes), while the red quantum dot layer on the sacrificial layer-retained portion and the retained photoresist are removed, but the red quantum dot layer on the exposed ITO conductive layer is retained so that a patterned red quantum dot layer is obtained.

The aforesaid steps are successively repeated to obtain green quantum dot layer and blue quantum dot layer in regions beyond the red quantum dot layer.

A hole transport layer material of 40 nm and a hole injection material of 5 nm are successively deposited by vacuum evaporation, and finally silver layer of 120 nm is deposited as the conductive anode.

Another embodiment of the present disclosure also provides an electronic substrate comprising one or more light-emitting diode devices manufactured by, e.g., the method of manufacturing light-emitting diode device as shown in FIG. 5.

Figure 9:
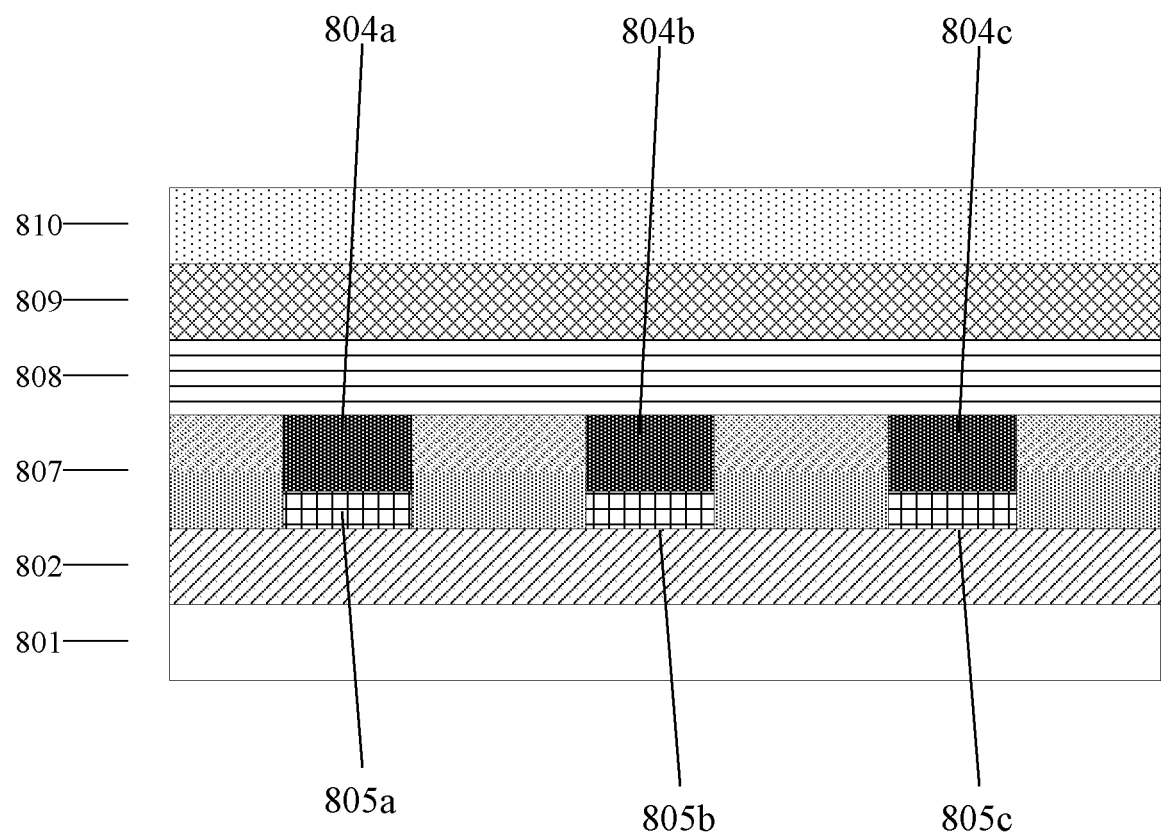
FIG. 9 is a schematically structural view of an electronic substrate according to an embodiment of the present disclosure.

As shown in FIG. 9, the electronic substrate comprises a plurality of light-emitting diode devices, comprising, e.g., a first light-emitting diode device, a second light-emitting diode device, and a third light-emitting diode device which are disposed on the substrate 801 in parallel.

The first light-emitting diode device comprises a first electrode layer 802, a first electron transport layer 805*a*, a first light-emitting layer 804*a*, a hole transport layer 808, a hole injection layer 809, and a second electrode layer 810, which are successively stacked.

The second light-emitting diode device comprises a first electrode layer 802, a second electron transport layer 805*b*, a second light-emitting layer 804*b*, a hole transport layer 808, a hole injection layer 809, and a second electrode layer 810, which are successively stacked.

The third light-emitting diode device comprises a first electrode layer 802, a third electron transport layer 805*c*, a third light-emitting layer 804*c*, a hole transport layer 808, a hole injection layer 809, and a second electrode layer 810, which are successively stacked.

In this embodiment, the first light-emitting diode device, the second light-emitting diode device, and the third light-emitting diode device share the common first electrode layer 802, hole transport layer 808, hole injection layer 809, and second electrode layer 810.

In this embodiment, when the first light-emitting layer 804*a*, the second light-emitting layer 804*b*, and the third light-emitting layer 804*c* emit the same light, the first electrode in the first electrode layer 802 corresponding to the first light-emitting layer 804*a*, the second light-emitting layer 804*b*, and the third light-emitting layer 804*c* can be shared; and when the first light-emitting layer 804*a*, the second light-emitting layer 804*b*, and the third light-emitting layer 804*c* emit different light, e.g., with different intensities or colors, the first electrodes in the first electrode layer 802 corresponding to the first light-emitting layer 804*a*, the second light-emitting layer 804*b* and the third light-emitting layer 804*c* are disposed on the same layer, but independent of each other.

For example, the first electron transport layer 805*a*, the second electron transport layer 805*b*, and the third electron transport layer 805*c* are disposed in the layer. Or, for example, the first light-emitting layer 804*a*, the second light-emitting layer 804*b*, the third light-emitting layer 804*c* are disposed in the same layer for emitting light with different colors.

As described above, the first light-emitting diode device, the second light-emitting diode device, and the third light-emitting diode device can share one or more layers selected from the group consisting of the first electrode layer 802, the hole transport layer 808, the hole injection layer 809, and the second electrode layer 810, but do not share all of the layers.

In different embodiments, in order to drive the light-emitting diode device to operate and emit light, the electronic substrate can also comprise a passive driving circuit or an active driving circuit. In the case that the electronic substrate comprise an active driving circuit and used in, e.g., a display device, the electronic substrate can be prepared as an array substrate so that the afore-described substrate comprises a driving circuit in additional to glass substrate or plastic substrate, for example.

In at least an embodiment, the aforesaid electronic substrate is an array substrate, and a plurality of light-emitting diode devices are disposed on the substrate in an array manner, for example. The electronic substrate comprise a pixel array comprising a plurality of sub-pixels disposed in array, each of the sub-pixels comprises a plurality of light-emitting diode devices (i.e., LED elements) and a pixel driving circuit for driving the LED elements, the LED device is in electric connection with the corresponding pixel driving circuit.

For example, the pixel driving circuit for sub pixels is a 2T1C pixel circuit, which comprises two TFTs (thin film transistors) and a storage capacitor Cs to drive the LED element to emit light, in which one of the two TFTs is a driving transistor and the other one is a data writing transistor. For example, on the basis of the above 2T1C pixel driving circuit, the pixel driving circuit can further have a compensation function, which can be realized by voltage compensation, current compensation, or hybrid compensation. The pixel driving circuit with compensation function can be, e.g., 4T1C or 4T2C, which will not be described in detail herein.

The array substrate can further comprise a gate electrode driving circuit and a data driving circuit. The pixel array further comprises a plurality of gate lines and a plurality of data lines intersected with the gate lines; the plurality of gate lines are in electric connection with the gate driving circuit, e.g., correspondingly connecting to the plurality of sub-pixel row of the pixel array; the gate driving circuit provides scanning signals for the plurality of gate lines to control the plurality of sub-pixel rows to turn-on successively; the plurality of data lines are in electric connection with the data driving circuit, e.g., correspondingly connecting to the plurality of sub-pixel columns of the pixel array, and the data driving circuit applies data signals on the plurality of data lines to write data signals into the corresponding sub-pixel row when the plurality of sub-pixel rows are turned on, respectively, so as to achieve the display of one frame image.

Embodiments of the present disclosure also provides an electronic apparatus. The electronic apparatus comprises the electronic substrate as described above. For example, the electronic apparatus is a display apparatus, and the electronic substrate is an array substrate.

As persons skilled in the art understand the display equipment can further comprise other necessary packaging elements and control circuits, which are not limited here.

The display device can be realized as any products or components having display function, such as mobile phones, tablet PCs, televisions, displays, notebook computers, digital photo frame, navigator, or the like.

The following points should be noted:

(1) The accompanying drawings involve only the structure(s) in connection with the embodiment(s) of the present disclosure, and other structure(s) can be referred to common design(s).

(2) For clarity, in the drawings used to describe embodiments of the present disclosure, the thickness of layers or regions may be exaggerated or reduced, i.e., the drawings are not drawn to scale.

(3) Without conflicting with each other, features in one embodiment or in different embodiments can be combined to obtain new embodiments.

The above description is only the exemplary implementations of the present disclosure, and the scope of the present disclosure is not limited thereto. The scope of the present disclosure should be defined by the claims.

What is claimed is:

1. A method of patterning a light-emitting layer, comprising:
    providing a substrate;
    forming a first electrode layer on the substrate;
    forming a sacrificial layer on the first electrode layer;
    patterning the sacrificial layer to remove the sacrificial layer in a first region of the substrate and retain the sacrificial layer in a second region of the substrate, wherein the first electrode layer is at least partially located in the first region;
    forming a first carrier auxiliary layer in the first region and the second region;
    forming a light-emitting layer on the first carrier auxiliary layer, wherein the light-emitting layer is coupled with the first electrode layer via the first carrier auxiliary layer at least in the first region; and
    removing the retained sacrificial layer in the second region and the first carrier auxiliary layer and the light-emitting layer covering the retained sacrificial layer, and retaining the first carrier auxiliary layer and the light-emitting layer in the first region, to pattern the light-emitting layer; wherein the light-emitting layer is a quantum dot layer.

2. The method according to claim 1, further comprising:
    after forming the first electrode layer on the substrate and before forming the sacrificial layer on the first electrode layer, forming a pixel definition layer on the substrate and the first electrode layer, wherein the pixel definition layer comprises at least one pixel definition opening which at least partially exposes the first electrode layer, and the first region at least partially overlaps with the at least one pixel definition opening.

3. The method according to claim 1, wherein
    the patterning the sacrificial layer comprises:
    forming a first photoresist layer on the sacrificial layer, exposing and developing the first photoresist layer to remove the first photoresist layer in the first region and retain the first photoresist layer in the second region, to form a first photoresist pattern,
    patterning the sacrificial layer using the first photoresist pattern to remove the sacrificial layer in the first region of the substrate; and
    the removing the retained sacrificial layer in the second region and the first carrier auxiliary layer and the light-emitting layer covering the retained sacrificial layer comprises:
    removing the first photoresist layer retained in the second region, together with the retained sacrificial layer in the second region and the first carrier auxiliary layer and the light-emitting layer covering the retained sacrificial layer.

4. The method according to claim 3, wherein the patterning the sacrificial layer using the first photoresist pattern comprises:
    patterning the sacrificial layer by dry etching using the first photoresist pattern.

5. The method according to claim 1, wherein the sacrificial layer is made of an organic material, and the organic material is one or more selected from the group consisting of: fluorene-based material, carbazole-based materials, perylene-based materials and aromatic acid-based materials.

6. The method according to claim 5, wherein the organic material is one or more selected from the group consisting of: dibromoaminofluorene, dibromodimethylaminopropylfluorene, bromocarbazole, dialdehyde carbazole, hydroxycarbazole, aminonaphthalimide, polyvinylpyrrolidone, dihydroxyphenanthroline, dioctyltetracarboxydiimide, isopropylphenylperylenetetraformyldiimine, fullerenebenzoic acid, fullerenephosphoric acid, and p-ethylbenzoic acid.

7. The method according to claim 1, wherein the removing the retained sacrificial layer located in the second region and the first carrier auxiliary layer and the light-emitting layer covering the retained sacrificial layer comprising:
   using an organic solvent to remove the retained sacrificial layer located in the second region and the first carrier auxiliary layer and the light-emitting layer covering the retained sacrificial layer,
   wherein the organic solvent is one or more selected from the group consisting of alcoholic solvents.

8. The method according to claim 7, wherein the alcoholic solvents are one or more selected from the group consisting of ethanol, propanol, iso-propanol, n-butanol, iso-butanol, n-pentanol, iso-pentanol, or any mixture thereof.

9. The method according to claim 1, wherein the first electrode layer is a cathode layer, and the first carrier auxiliary layer is an electron transport layer.

10. The method according to claim 9, wherein the cathode layer is an ITO layer, and the electron transport layer is a zinc oxide layer.

11. The method according to claim 1, wherein the sacrificial layer has a thickness greater than a sum of a thickness of the first carrier auxiliary layer and a thickness of the light-emitting layer.

12. A method of manufacturing a light-emitting diode device comprising:
    forming an element unit comprising the patterned light-emitting layer or a plurality of element units each comprising the patterned light-emitting layer by the method of patterning the light-emitting layer according to claim 1.

13. The method according to claim 12, wherein luminescent materials of the patterned light-emitting layers of the plurality of element units are different from each other.

14. The method according to claim 13, further comprising:
    forming a second carrier auxiliary layer and a second electrode layer on the element unit comprising the patterned light-emitting layer or each of the plurality of parallel element units comprising the patterned light-emitting layer.

15. The method according to claim 2, wherein the sacrificial layer is made of an organic material, and the organic material is one or more selected from the group consisting of: fluorene-based material, carbazole-based materials, perylene-based materials and aromatic acid-based materials.

16. The method according to claim 15, wherein the organic material is one or more selected from the group consisting of: dibromoaminofluorene, dibromodimethylaminopropylfluorene, bromocarbazole, dialdehyde carbazole, hydroxycarbazole, aminonaphthalimide, polyvinylpyrrolidone, dihydroxyphenanthroline, dioctyltetracarboxydiimide, isopropylphenylperylenetetraformyldiimine, fullerenebenzoic acid, fullerenephosphoric acid, and p-ethylbenzoic acid.

17. The method according to claim 16, wherein the removing the retained sacrificial layer located in the second region and the first carrier auxiliary layer and the light-emitting layer covering the retained sacrificial layer comprising:
    using an organic solvent to remove the retained sacrificial layer located in the second region and the first carrier auxiliary layer and the light-emitting layer covering the retained sacrificial layer,
    wherein the organic solvent is one or more selected from the group consisting of alcoholic solvents.

18. The method according to claim 17, wherein the alcoholic solvents are one or more selected from the group consisting of ethanol, propanol, iso-propanol, n-butanol, iso-butanol, n-pentanol, iso-pentanol, or any mixture thereof.

19. The method according to claim 9, wherein the first electrode layer is a cathode layer, and the first carrier auxiliary layer is an electron transport layer.

* * * * *